(12) United States Patent
Lim et al.

(10) Patent No.: US 8,872,233 B2
(45) Date of Patent: Oct. 28, 2014

(54) SEMICONDUCTOR STRUCTURE

(75) Inventors: Taek Lim, Erzhausen (DE); Rolf Aidam, Wyhl (DE); Lutz Kirste, Freiburg (DE); Ruediger Quay, Freiburg (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 100 days.

(21) Appl. No.: 13/419,583

(22) Filed: Mar. 14, 2012

(65) Prior Publication Data

US 2013/0181224 A1 Jul. 18, 2013

Related U.S. Application Data

(63) Continuation of application No. PCT/EP2010/063496, filed on Sep. 14, 2010.

(30) Foreign Application Priority Data

Sep. 15, 2009 (DE) .......................... 10 2009 041 548

(51) Int. Cl.
 H01L 29/66 (2006.01)
 H01L 21/338 (2006.01)
 H01L 29/778 (2006.01)
 H01L 27/06 (2006.01)

(52) U.S. Cl.
 CPC .......... H01L 29/778 (2013.01); H01L 27/0605 (2013.01)
 USPC ............................. 257/194; 257/615; 438/172

(58) Field of Classification Search
 CPC .......................... H01L 29/778; H01L 27/0605
 USPC ............................ 257/76, 194, 615; 438/172
 See application file for complete search history.

(56) References Cited

U.S. PATENT DOCUMENTS 5,192,987 A * 3/1993 Khan et al. ................. 257/183.1
6,618,410 B1 * 9/2003 Fischer et al. ............. 372/45.01

(Continued)

FOREIGN PATENT DOCUMENTS

JP 2003-229439 A 8/2003
JP 2003-257999 A 9/2003

(Continued)

OTHER PUBLICATIONS

English translation of Official Communication issued in corresponding International Application PCT/EP2010/063496, mailed on Apr. 12, 2012.

(Continued)

*Primary Examiner* — Nicholas Tobergte
(74) *Attorney, Agent, or Firm* — Keating & Bennett, LLP (57) ABSTRACT

A semiconductor structure includes a barrier layer, a spacer structure, and a channel layer. The barrier layer includes a group III nitride. The spacer structure includes first and second aluminum nitride layers and an intermediate layer. The intermediate layer includes a group III nitride and is between the first and second aluminum nitride layers. The intermediate layer has a first free charge carrier density at an interface with the second aluminum nitride layer. The spacer structure is between the barrier layer and the channel layer. The channel layer includes a group III nitride and has a second free charge carrier density at an interface with the first aluminum nitride layer of the spacer structure. The first aluminum nitride layer, the intermediate layer, and the second aluminum nitride layer have layer thicknesses so the first free charge carrier density is less than 10% of the second free charge carrier density.

12 Claims, 6 Drawing Sheets

(56) References Cited

U.S. PATENT DOCUMENTS

| | | |
|---|---|---|
| 2002/0058349 A1 | 5/2002 | Khan et al. |
| 2006/0170003 A1 | 8/2006 | Saito et al. |
| 2006/0197109 A1 | 9/2006 | Saxler |
| 2008/0054303 A1 | 3/2008 | Beach |

FOREIGN PATENT DOCUMENTS

| | | |
|---|---|---|
| JP | 2006-216671 A | 8/2006 |
| JP | 2007-250721 A | 9/2007 |
| JP | 2008-098298 A | 4/2008 |
| WO | 2008/148101 A1 | 12/2008 |
| WO | WO 2008148101 A1 * | 12/2008 |

OTHER PUBLICATIONS

Official Communication issued in International Patent Application No. PCT/EP2010/063496, mailed on Dec. 20, 2010.

Lim et al., "Design of near lattice-matched AlGaInN-barriers for highly-scalable GaN-based transistor structures," Phys. Status Solidi C 7, No. 7-8, Apr. 28, 2010, pp. 1958-1960.

Lim et al., "Compositional variation of nearly lattice-matched InAlGaN alloys for high electron mobility transistors," Applied Physics Letters, vol. 96, No. 25, Jun. 25, 2010, pp. 252108-1 to 252108-3.

Liu et al., "Demonstration of undoped quaternary AlInGaN/GaN hetersostructure field-effect transistor on sapphire substrate," Applied Physics Letters, vol. 86, May 27, 2005, pp. 223510-1 to 22315-3.

Liu et al., "Novel Quaternary AlInGaN/GaN Heterostructure Field Effect Transistors on Sapphire Substrate," Japanese Journal of Applied Physics, vol. 45, No. 7, Jul. 7, 2006, pp. 5728-5731.

Adivarahan et al., "Double-Recessed High-Frequency AlInGaN/InGaN/GaN Metal-Oxide Double Heterostructure Field-Effect Transistors," IEEE Transactions on Electron Devices, vol. 55, No. 2, Feb. 2008, pp. 495-499.

Gonschorek et al., "High electron mobility lattice-matched AlInN/GaN field-effect transistor heterostructures," Applied Physics Letters, vol. 89, Aug. 9, 2006, pp. 062106-1 to 062106-3.

Official Communication issued in corresponding Japanese Patent Application No. 2012-529243, mailed on Sep. 25, 2013.

* cited by examiner

SEMICONDUCTOR STRUCTURE

CROSS-REFERENCE TO RELATED APPLICATIONS

This application is a continuation of copending International Application No. PCT/EP2010/063496, filed Sep. 14, 2010, which is incorporated herein by reference in its entirety, and additionally claims priority from German Application No. DE 102009041548.3, filed Sep. 15, 2009, which is also incorporated herein by reference in its entirety.

BACKGROUND OF THE INVENTION

Embodiments according to the invention relate to heterostructure semiconductor components and in particular to a semiconductor structure, a transistor and a method for manufacturing a semiconductor structure.

With the heterostructure field effect transistor, the current flowing through the component between the two ohmic contacts, the source and drain, is ideally controlled in a powerless method by means of a voltage applied to a non-conducting metal semiconductor contact (gate). In contrast with homogeneous field effect transistors, an HFET has a heterogeneous material system. This utilizes the fact that a potential pot having discrete energy levels and representing the channel is formed at the interface when combining two suitable semiconductor materials having different band gap energies. The advantage lies in the separation of the charge carriers and the doped region. Due to the fact that the current transport takes place in the undoped material, high mobilities and thus good high-frequency properties can be achieved. The charge carrier concentration in the channel is modulated by the applied gate voltage.

Heterostructure field effect transistors (HFETs), also known as high electron mobility transistors (HEMTs) based on nitrides of group III, are capable of handling higher powers than comparable devices based on other semiconductor material systems at high frequencies, usually 1-100 GHz. These abilities are a result of the unique material properties of group III nitrides, which have a broad band gap, a large breakdown field and a high charge carrier saturation velocity. By using the binary compounds aluminum nitride (AlN), gallium nitride (GaN), indium nitride (InN) and their alloys (ternary AlGaN, GaInN, AlInN as well as quaternary AlGaInN), a large bandwidth of desired material properties can be covered. Established applications cover mainly the range between 2 and 12 GHz. At higher frequencies, for example, around 35 GHz and 94 GHz for radar with a high spatial resolution, nitride HFETs can offer power levels not accessible for solid-state systems in the past. These applications necessitate a small gate length and thus thin barrier layers in combination with high surface charge carrier densities and high electron mobilities.

The best researched heterostructure for use with HFETs is the AlGaN/GaN system. Although the material growth and the component technology for AlGaN/GaN have reached a rather high level of maturity, the stress in the AlGaN layer is an inherent disadvantage, which results in physical limits for component design. This problem is especially serious in implementation of heterostructures with an ace electron density of more than $1.5 \times 10^{13}$ cm$^{-2}$, which is almost impossible due to stress relaxation and the limited lifetime of AlGaN/GaN. Another disadvantage of AlGaN/GaN associated with this is the difficulty of producing heterostructures, which have a high face electron density at the same time and a thin barrier, such as that necessitated for effective scaling with the gate length for fast transistors.

In recent reports, the AlGaN barrier has been replaced by the compound AlInN with an indium concentration of approx. 18% (see, for example, "Gonschorek et al., Appl. Phys. Lett. 89, 062106, (2006)" and "Xie et al., Appl. Phys. Lett. 91, 132116, (2007)"). With this composition, the in-plane lattice constant of AlInN is the same as that of GaN, so that an AlInN/GaN heterostructure is lattice-matched and stress-free. Because of the high aluminum content and consequently the high spontaneous polarization of lattice-matched AlInN, a barrier layer thickness of less than 10 nm is sufficient to obtain a high face electron density. However, AlInN has alloy non-miscibility and consequently has a poor quality as a material. Simple AlInN/GaN heterostructures have only a fraction of the electron mobility of typical AlGaN/GaN wafers. Furthermore, ohmic contacts with AlInN-based structures, which are essential for HFET operation, have terminal resistances that are higher by several factors than those with AlGaN-based references.

The electron mobility with AlInN-based heterostructures can be greatly improved by inserting an AlN intermediate layer between the GaN channel and the lattice-adapted barrier layer ("Gonschorek et al., Appl. Phys. Lett. 89, 062106, (2006)"). The AlN serves as a spacer separating the two-dimensional electron gas (2DEG) in the channel from the AlInN barrier layer and permitting an improved interfacial roughness in comparison with a direct AlInN/GaN sequence. Nevertheless, even optimized AlInN/AlN/GaN structures only have mobility values substantially lower than those of AlGaN/GaN or AlGaN/AlN/GaN structures.

Additional examples of heterostructures and their applications are presented below. For example, US Patent 2002/0058349 A1 describes a method for producing nitride-based heterostructure components by using quaternary layers containing AlInNGaN.

In addition, US Patent 2008/0054303 A1 describes a group III nitride-based field effect transistor, which has an improved power characteristic due to manipulation of the relationship between the in-plane lattice constants of the interface of material layers.

In addition, US 2006/0197109 A1 describes a transistor having a high electron mobility with a GaN channel structure having a very thin (Al, In, Ga)N subchannel layer arranged between a first GaN channel layer and a second GaN channel layer to bring about a band bending induced by the piezoelectric and spontaneous charge carriers in association with the (Al, In, Ga)N subchannel layer. Two or more channels are therefore formed to improve the linearity of the transistor.

The publication "Liu et al., Appl. Phy. Lett. 86, 223510 (2005) Demonstration of undoped quaternary AlInGaN/GaN heterostructure field effect transistor on sapphire substrate" demonstrates an undoped AlInGaN heterostructure field effect transistor on a sapphire substrate.

In addition, the publication "Liu et al., Jpn. J. Appl. Phys. 45, 5728-5731 (2006) Novel quaternary AlInGaN/GaN heterostructure field effect transistors on sapphire substrate" discloses an undoped quaternary AlInGaN/GaN heterostructure field effect transistor with different molar amounts of aluminum produced on a sapphire substrate.

In addition, "Adivarahan et al., IEEE Trans. Electron Devices 55, 495-499 (2008) Double-recessed high-frequency AlInGaN/GaN metal oxide double heterostructure field effect transistors" discloses a low-threshold AlInGaN/InGaN/GaN metal oxide semiconductor double heterostructure field effect transistor for high-frequency applications.

SUMMARY

According to an embodiment, a semiconductor structure may have: a barrier layer comprising AlGaInN, AlInN or AlGaN; a spacer structure having a first aluminum nitride layer, an intermediate layer and a second aluminum nitride layer, wherein the intermediate layer has a group III nitride and is arranged between the first aluminum nitride layer and the second aluminum nitride layer and wherein the intermediate layer has a first free charge carrier density at an interface with the second aluminum nitride layer; and a channel layer having a group III nitride, wherein the spacer structure is arranged between the barrier layer and the channel layer, wherein the spacer structure is grown on the channel layer and the AlGaInN barrier layer, the AlInN barrier layer or the AlGaN barrier layer is grown on the spacer structure, and wherein the channel layer has a second free charge carrier density at an interface with the first aluminum nitride layer of the spacer structure, wherein the first aluminum nitride layer, the intermediate layer and the second aluminum nitride layer comprise layer thicknesses such that the first free charge carrier density is less than 10% of the second free charge carrier density.

According to another embodiment, a transistor may have: an inventive semiconductor structure; a source contact which is electrically connected to the channel layer; a drain contact which is electrically connected to the channel layer; a gate contact which is arranged between the source contact and the drain contact and is designed to control an amperage of an electric current between the source contact and the drain contact in the channel layer by applying an electric gate potential.

According to another embodiment, a semiconductor structure may have: a barrier layer having AlGaInN, AlInN or AlGaN; a spacer structure having a first aluminum nitride layer, a second aluminum nitride layer and a gallium nitride layer, wherein the first aluminum nitride layer has a layer thickness between 0.4 nm and 1.4 nm, wherein the second aluminum nitride layer has a layer thickness between 0.4 nm and 1.4 nm, wherein the gallium nitride layer has a layer thickness of less than 1.5 nm, wherein the gallium nitride layer is arranged between the first aluminum nitride layer and the second aluminum nitride layer and wherein the gallium nitride layer has a first free charge carrier density at an interface with the second aluminum nitride layer; and a channel layer having gallium nitride or InGaN, wherein the spacer structure is arranged between the barrier layer and the channel layer, wherein the spacer structure is grown on the channel layer and the AlGaInN barrier layer, the AlInN barrier layer or the AlGaN barrier layer is grown on the spacer structure, and wherein the channel layer has a second free charge carrier density at an interface with the first aluminum nitride layer of the spacer structure, wherein the first aluminum nitride layer, the gallium nitride layer and the second aluminum nitride layer comprise layer thicknesses such that the first free charge carrier density is less than 10% of the second free charge carrier density.

According to another embodiment, a method for producing a semiconductor structure may have the steps of: producing a channel layer having a group III nitride; producing a first aluminum nitride layer on the channel layer; producing an intermediate layer on the first aluminum nitride layer wherein the intermediate layer has a group III nitride; producing a second aluminum nitride layer on the intermediate layer; and producing a barrier layer having a group III nitride, wherein the AlGaInN barrier layer, the AlInN barrier layer or the AlGaN barrier layer is grown on the second aluminum nitride layer, wherein the intermediate layer has a first free charge carrier density at an interface with the second aluminum nitride layer and wherein the channel layer has a second free charge carrier density at an interface with the first aluminum nitride layer, wherein the first aluminum nitride layer, the intermediate layer and the second aluminum nitride layer comprise layer thicknesses such that the first free charge carrier density is less than 10% of the second free charge carrier density.

One embodiment of the present invention provides a semiconductor structure including a barrier layer, a spacer structure and a channel layer. The barrier layer comprises a group III nitride. In addition, the spacer structure comprises a first aluminum nitride layer, a second aluminum nitride layer and an intermediate layer. The intermediate layer comprises a group III nitride and is arranged between the first aluminum nitride layer and the second aluminum nitride layer. The intermediate layer comprises a first free charge carrier density at an interface with the second aluminum nitride layer. The spacer structure is arranged between the barrier layer and the channel layer. The channel layer comprises a group III nitride and comprises a second free charge carrier density at the interface with the first aluminum nitride layer of the spacer structure. The first aluminum nitride layer, the second aluminum nitride layer and the intermediate layer comprise layer thicknesses so that the first free charge carrier density is less than 10% of the second free charge carrier density.

Embodiments according to the invention are based on the central idea that the influence of the material quality of the barrier has only a minor influence on the electrically relevant properties of the semiconductor structure, e.g., in the form of the charge carrier mobility in the channel layer, due to the spacer structure. Therefore a material having the same natural lattice constant as the material of the channel layer may be used for the barrier layer, for example, although such materials can often be produced only with a much lower material quality than other materials with a different lattice constant. Due to the choice of a barrier material with the same natural lattice constant, internal stress can be greatly reduced and therefore the lifetime of such semiconductor structures can be definitely increased with little or no change in the charge carrier mobility. In addition, the channel layer can be protected by the spacer structure, for example, during the production of the barrier layer, so that a high quality of the material of the channel layer can be maintained, which then has a direct effect on the charge carrier mobility.

In some embodiments according to the invention, the layer thickness of the intermediate layer is less than two times the layer thickness of the first aluminum nitride layer. This makes it possible to achieve the result that the first charge carrier density in the intermediate layer is kept low in comparison with the second charge carrier density in the channel layer.

Several embodiments according to the invention are based on a semiconductor structure including a barrier layer, a spacer structure and a channel layer. The barrier layer comprises AlGaInN or AlGaN as the material and the channel layer comprises GaN or InGaN as the material. The spacer structure includes a first aluminum nitride layer, a second aluminum nitride layer and a GaN layer. The first aluminum nitride layer and the second aluminum nitride layer comprise layer thickness between 0.4 nm and 1.4 nm. The GaN layer comprises a layer thickness of less than 1.5 nm. The GaN layer is arranged between the first aluminum nitride layer and the second aluminum nitride layer and comprises a first free charge carrier density at an interface with the second aluminum nitride layer. In addition, the spacer structure is arranged between the barrier layer and the channel layer, and the channel layer comprises a second free charge carrier density at the interface with the first aluminum nitride layer of the spacer structure. The first aluminum nitride layer, the second aluminum nitride layer and the GaN layer comprise layer thicknesses such that the first free charge carrier density is less than 10% of the second free charge carrier density.

BRIEF DESCRIPTION OF THE DRAWINGS

Embodiments of the present invention will be detailed subsequently referring to the appended drawings, in which.

DETAILED DESCRIPTION OF THE INVENTION

The same reference numerals are used below to some extent for objects and function units having the same or similar functional properties.

Figure 1:
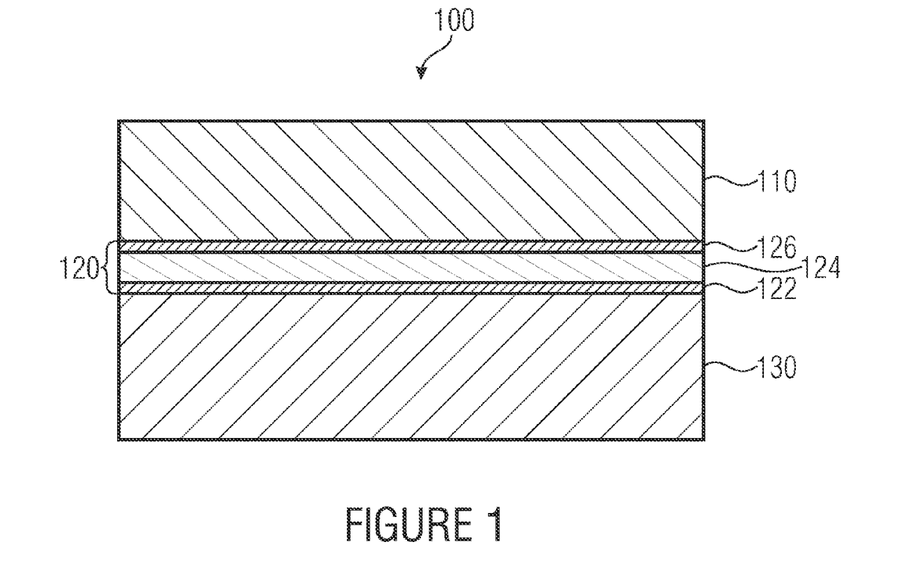
FIG. 1 shows a schematic cross section through a semiconductor structure.

FIG. 1 shows a schematic cross section through a semiconductor structure 100 according to an embodiment of the invention. The semiconductor structure 100 includes a barrier layer 110, a spacer structure 120 and a channel layer 130. The barrier layer 110 comprises a group III nitride. The spacer structure 120 includes a first aluminum nitride layer 122, an intermediate layer 124 and a second aluminum nitride layer 126. The intermediate layer 124 comprises a group III nitride and is arranged between the first aluminum nitride layer 122 and the second aluminum nitride layer 126. In addition, the intermediate layer 124 comprises a first free charge carrier density at an interface with the second aluminum nitride layer 126. The spacer structure 120 is arranged between the barrier layer 110 and the channel layer 130. The channel layer 130, like the barrier layer 110, comprises a group III nitride and comprises a second free charge carrier density at the interface with the first aluminum nitride layer 122 of the spacer structure 120. The first aluminum nitride layer 122, the intermediate layer 124 and the second aluminum nitride layer 126 comprise layer thicknesses such that the first free charge carrier density is less than 10% of the second free charge carrier density.

A group III nitride is a compound of an element of group III of the periodic system of chemical elements, for example, aluminum, gallium or indium with nitrogen. Examples of group III nitrides are, among others, aluminum nitride AlN, gallium nitride GaN, indium nitride InN, aluminum gallium nitride AlGaN, gallium indium nitride GaInN, aluminum indium nitride AlInN and aluminum gallium indium nitride AlGaInN.

Due to the layer structure described here, a so-called two-dimensional electron gas (2DEG) can develop at the interface of the channel layer 130 with the first aluminum nitride layer 122 of the spacer structure 120. The two-dimensional electron gas has a much greater extent along the interface of the channel layer 130 in two orthogonal directions than in a direction perpendicular to the interface. The maximum charge carrier density of the two-dimensional electron gas does not need to develop directly at the interface but instead will normally develop near the interface within the extent of the two-dimensional electron gas orthogonal to the interface. The second free charge carrier density of the channel layer 130 may thus relate to a free charge carrier density directly at the interface or to the maximum free charge carrier density of the two-dimensional electron gas, for example. Accordingly, the first charge carrier density of the intermediate layer 124 may also relate to, for example, a free charge carrier density at the interface with the second aluminum nitride layer 126 or to a maximum free charge carrier density within the intermediate layer 124. The free charge carriers may be negative electrons or positive holes depending on the choice of material but in the following discussion electrons are assumed as the dominant free charge carriers.

If the layer thicknesses of the first aluminum nitride layer 122, the intermediate layer 124 and the second aluminum nitride layer are selected so that the first free charge carrier density is less than 10% of the second free charge carrier density, then a negligibly small conduction band or none at all will develop in the intermediate layer 124 of the spacer structure 120 in comparison with the channel layer. If a pronounced conduction channel were to develop in the intermediate layer 124, the material quality of the barrier layer 110 could have an equally negative influence on the electric properties of the semiconductor structure 100 as if the spacer structure 120 were to consist only of a single aluminum nitride layer. A conduction channel in the intermediate layer 124 is therefore undesirable and can be suppressed through a suitable choice of the layer thicknesses of the first aluminum nitride layer 122, the intermediate layer 124 and the second aluminum nitride layer 126. The conduction channel is considered as having been suppressed if the first free charge carrier density is less than 10% of the second free charge carrier density. The first free charge carrier density should be less than 5%, 2%, 1% or 0.5% of the second free charge carrier density.

Since the channel layer 130 is produced with the highest possible material quality, the highest possible theoretical upper limit for the charge carrier mobility can be preselected. Negative effects in production of the layers of the spacer structure 120 and of the barrier layer 110 as well as negative influences due to the choice of materials of the spacer structure and of the barrier layer 110 may result in this theoretical upper limit of the charge carrier mobility not being reachable. Through integration of the spacer structure 120 according to the invention, the influence of the quality of the material of the barrier layer 110 on the charge carrier mobility in the channel layer 130 can be significantly reduced. In addition, the channel layer 130 can be protected better in the production of the layers of the spacer structure 120 and of the barrier layer 110 so that the charge carrier mobility can be approximated much more closely than the theoretical upper limit.

In addition to the layer thicknesses of the first aluminum nitride layer 122, the intermediate layer 124 and the second aluminum nitride layer 126, the choice of the specific group III nitrides for the barrier layer, the intermediate layer and the channel layer may have an influence on the fact that the first charge carrier density is less than 10% of the second charge carrier density. The barrier layer 110, the intermediate layer 124 and the channel layer 130 may each comprise different, partially different or identical group III nitrides.

In some embodiments according to the invention, the intermediate layer 124 is thinner than two times the first aluminum nitride layer. Alternatively, the layer thickness of the intermediate layer 124 is less than 1.9 times the layer thickness of the first aluminum nitride layer minus 0.1 nm.

The first aluminum nitride layer 122 and the second aluminum nitride layer 126 each comprise a layer thickness greater than 0.4 nm and less than 1.4 nm (or greater than 0.6 nm and less than 1 nm), for example. The intermediate layer 124, for example, comprises a layer thickness of less than 1.5 nm (or less than 1.2 nm, 1 nm or 0.8 nm).

In some embodiments according to the invention, the barrier layer 110 is directly adjacent to the second aluminum nitride layer 126 of the spacer structure 120. For example, if the barrier layer 110 comprises AlGaInN or AlGaN as the group III nitride, tensions can therefore be reduced. If a GaN layer were also between the barrier layer 110 and the second aluminum nitride layer 126, for example, there would be stresses between the AlGaInN or AlGaN of the barrier layer 110. If the spacer structure 120 were to be sealed with GaN on the barrier side, then there would also be less protection of the channel during the growth of the semiconductor structure because GaN is typically significantly less resistant than AlN during growth.

Figure 2:
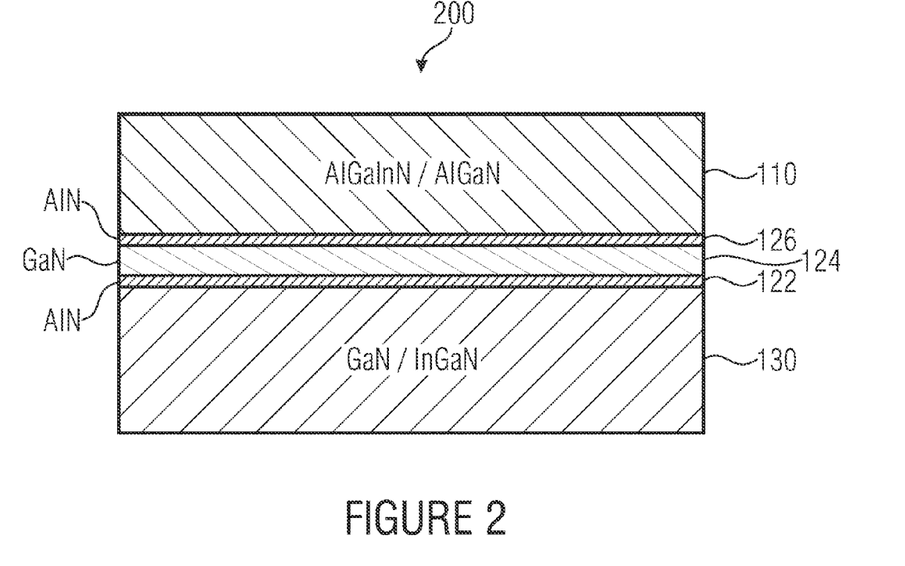
FIG. 2 shows a schematic cross section through a semiconductor structure.

FIG. 2 shows a schematic cross section through a semiconductor structure 200 according to one embodiment of the invention. The layer sequence of the semiconductor structure 200 corresponds to the layer sequence shown in FIG. 1. The barrier layer 110 comprises AlGaInN or AlGaN as the group III nitride. The intermediate layer 124 comprises gallium nitride and may also be referred to accordingly as a gallium nitride layer. In addition, the channel layer 130 comprises GaN or InGaN as the group III element. Furthermore, the first aluminum nitride layer and the second aluminum nitride layer comprise layer thicknesses between 0.4 nm and 1.4 nm, and the gallium nitride layer 124 comprises a layer thickness of less than 1.5 nm. The choice of materials of the individual layers and the layer thicknesses of the layers of the spacer structure 120 as described here makes it possible to ensure that the first charge carrier density will be less than 10% of the second charge carrier density.

Several embodiments according to the invention relate to a transistor having a semiconductor structure as shown in FIG. 1 or FIG. 2. In addition, the transistor comprises a source contact, a drain contact and a gate contact (control electrode). The source contact and the drain contact are electrically connected to the channel layer. The gate contact is arranged between the source contact and the drain contact and can control the amperage of an electric current between the source contact and the drain contact in the channel layer by applying an electric gate potential. The gate contact may be applied directly to the barrier layers, so that a Schottky contact is formed. Alternatively, an electrically insulating layer (gate dielectric) may be formed between the gate contact and the barrier layer.

In addition, the semiconductor structure may have a buffer layer directly adjacent to the channel layer and may have a substrate adjacent to the buffer layer. The substrate serves as a carrier material to which the buffer layer can be applied. The buffer layer may be used to suppress substrate influences on the active component (e.g., transistor) and to provide the most perfect possible crystal lattice for the further crystal growth.

The following channel layer is bordered at the top by the adjacent spacer structure followed by the barrier layer. Because of the different work functions and band gaps, a potential pot is formed in the conduction band at the interface between the channel layer and the first aluminum nitride layer in which the electrons are retained because of more favorable energetic conditions. This region is also referred to as the two-dimensional electron gas because the free directions of movement of the charge carriers are limited to only two directions in space because of the small bandwidth of this potential pot. If the two-dimensional electron gas is in an undoped channel layer, for example, then hardly any scattering processes occur in charge transport in comparison with, for example, doped layers due to the ionized donor trunks, leading to very good transport properties (e.g., high charge carrier mobility).

The position of the potential pot in relation to the Fermi level can be adjusted via a voltage on the gate contact which is implemented by a blocking Schottky contact, for example. In the area of the source contact and the drain contact, there may also be a doped layer on the barrier layer, serving to improve the ohmic contact of the drain contact and the source contact.

Such transistors are also known as heterostructure field effect transistors.

Figure 3:
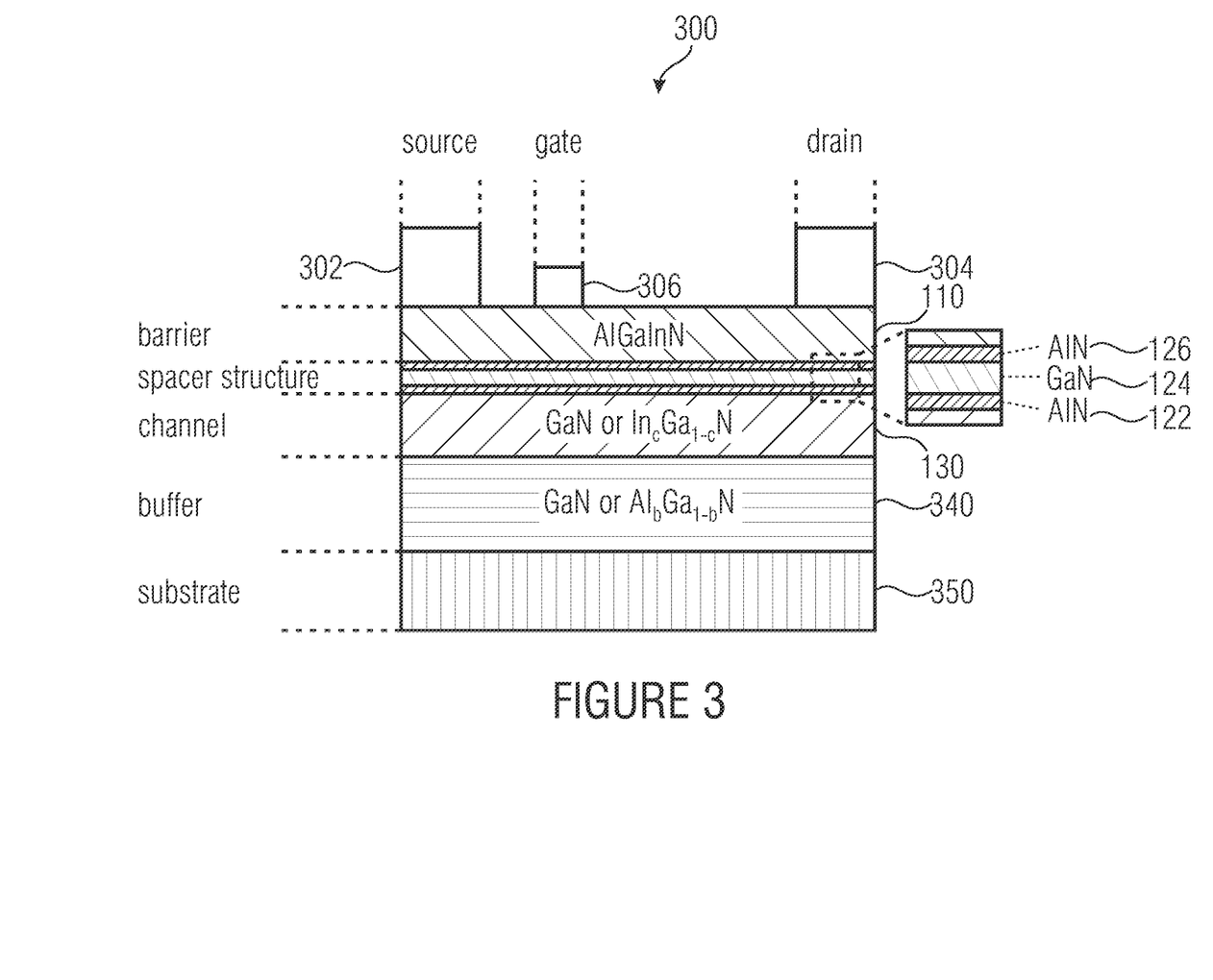
FIG. 3 shows a schematic cross section through a semiconductor structure.

FIG. 3 shows a schematic cross section through a semiconductor structure 300 according to an embodiment of the invention. The semiconductor structure 300 comprises a layer structure which corresponds to the semiconductor structure as shown in FIG. 1. In addition, the semiconductor structure 300 adjacent to the channel layer 130 comprises a buffer layer 340 and, adjacent to that, a substrate 350, such as that already described above. The semiconductor structure 300 may be further processed to produce a heterostructure field effect transistor, as indicated by the source contact 302, the drain contact 304 and the gate contact 306, for example.

The schematic diagram of this embodiment is not drawn true to scale.

In producing the semiconductor structure 300, the buffer layer 340 is first grown on the substrate 350, followed by the channel layer 130. The layers of the spacer structure 120 are applied to the channel layer 130 in the form of the first aluminum nitride layer 122, the intermediate layer 124 and the second aluminum nitride layer 126. Then the barrier layer 110 is grown on that.

In this example the spacer or the spacer structure 120 consists of an aluminum nitride layer followed by a gallium nitride layer followed by another aluminum nitride layer. All three partial layers comprise thicknesses between several Angstrom and a few nanometers, but usually at or less than 1 nm. Suitable thicknesses can be determined on the basis of Poisson-Schroedinger simulations, for example, apart from other methods, to optimize the variation in the conduction band energy with respect to the depth and to ensure that no second two-dimensional electron gas is formed in the gallium nitride partial layer (intermediate layer).

Figure 4:
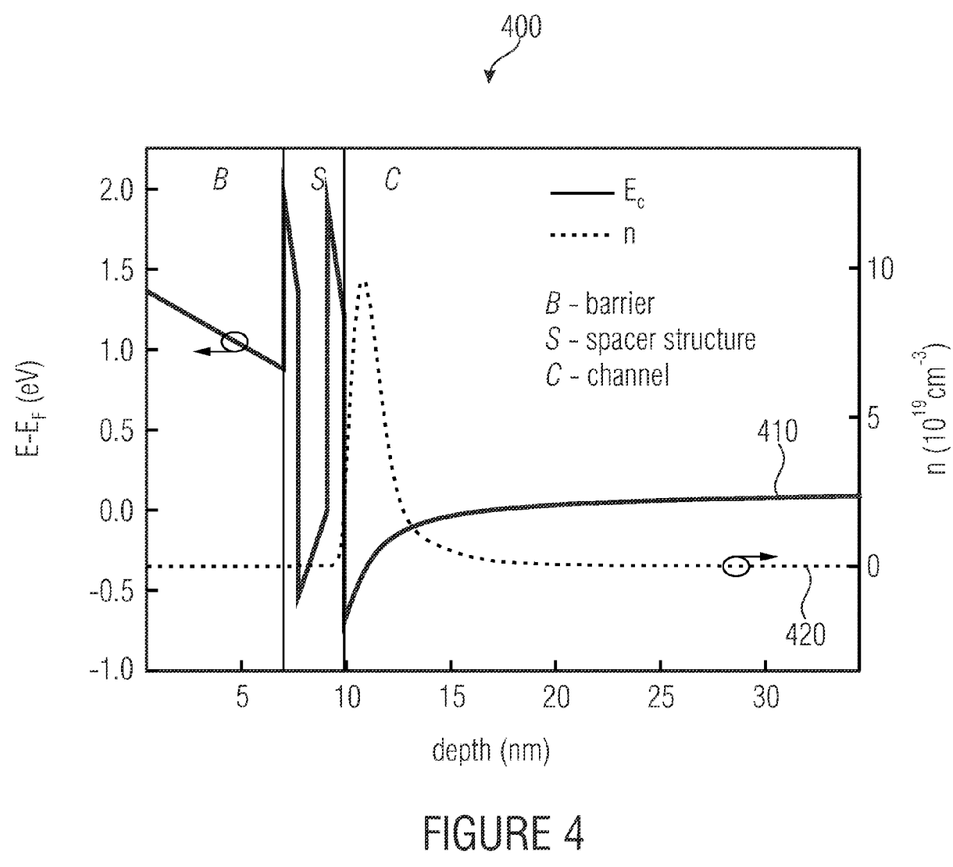
FIG. 4 shows a Poisson Schroedinger simulation of a conduction band of an exemplary heterostructure according to FIG. 3.

FIG. 4 therefore shows an example of a Poisson-Schroedinger simulation 400 of a conduction band 410 and a charge carrier density 420 for an exemplary heterostructure according to the example shown in FIG. 3. The diagram 400 shows the depth measured in nanometers on the x axis with respect to the surface of the barrier layer facing away from the channel. The y axis shows the energy difference between the energy E and the Fermi energy $E_f$ in electron volts for the conduction band on the one hand and on the other hand also shows the charge carrier density n in units of $10^{19}$ cm$^{-3}$. The charge carrier density shows a definite maximum near the interface of the channel layer with the first aluminum nitride layer. The two aluminum nitride layers comprise an adequate thickness and the intermediate layer is thin enough so that the charge carrier density developing in the intermediate layer is only negligible in comparison with the charge carrier density of the channel layer. The barrier layer comprises a greater band gap than the channel layer so that there is a significantly lower free charge carrier density in the barrier layer than in the channel layer. As shown in FIG. 4 the conduction band has an energy minimum in the area of the channel layer (near the interface with the spacer structure).

In the embodiment shown in FIG. 3, the barrier layer is made of $Al_xGa_{1-x-y}In_yN$ with a composition which is almost adapted to gallium nitride. The x/y ratio is in the range between 4.5 and 5, for example. Under these conditions the gallium concentration 1-x-y, e.g., may vary from 0 to 0.9, which also includes AlInN, for example, which is lattice-matched with respect to gallium nitride. Lattice-matched in this context means, for example, that the natural lattice constants of the materials are the same or almost the same. The AlGaInN layer (barrier layer) has a thickness of or less than 10 nm, for example. The thickness and the composition of the AlGaInN (barrier layer), specifically its gallium concentration may be varied to adjust the surface electron density of the two-dimensional electron gas, the height of the barrier at the gate contact, the threshold voltage of the HFET and/or to optimize the ohmic terminal resistance.

In alternative embodiments, the spacer (spacer structure) may consist of an arbitrary number of partial layers greater than or equal to 3, such that the first and last partial layers are made of aluminum nitride. The AlGaInN layer (barrier layer) may also comprise thicknesses of more than 10 nm to optimize them with respect to a charge carrier limitation instead of scalability. Deviations from lattice-matched conditions, in which x/y is outside of the range between 4.5 and 5, may also be used to adjust the threshold voltage, for example.

The channel layer 130 may contain gallium nitride or $In_cGa_{1-c}N$, for example, and the buffer layer 340 may contain gallium nitride or $Al_bGa_{1-b}N$.

Possible layer thickness combinations of the spacer (the spacer structure) can be determined by simulation. For example, if a charge carrier concentration of less than $10^{18}$ cm$^{-3}$ in the gallium nitride intermediate layer 124 is needed, so that, for example, the density is much less than 1% charge carriers per unit of area in this layer in comparison with the channel, this yields approximately the following relationship:

$$d(\text{GaN,intermediate layer}) < (1.9 \times d(\text{AlN,channel side}) - 0.1 \text{ nm}).$$

In other words, the layer thickness of the intermediate layer 124 is less than 1.9 times the layer thickness of the first aluminum nitride layer minus 0.1 nm. This information is applicable, for example, to a fixed thickness of the aluminum nitride layer on the barrier side (the second aluminum nitride layer) and the barrier. Since an amount of several percent charge carriers (<10%) in the gallium nitride intermediate layer can still be allowed, the layer thicknesses of the intermediate layer and the first aluminum nitride layer may also be selected according to the following equation:

$$d(\text{GaN,intermediate layer}) < 2 \times d(\text{AlN,channel side}).$$

In other words, the layer thickness of the intermediate layer is less than two times the layer thickness of the first aluminum nitride layer.

In the approach described here, the AlN/GaN/AlN layer sequence serves as a spacer structure to, for example, reduce negative effects of the barrier on the electrons in the channel. The charge carrier density in the GaN intermediate layer is minimized in this design. In the example shown in FIG. 3 the charge carrier density per unit of area in the actual channel is, for example, approx. $2 \times 10^{13}$ cm$^{-2}$ and only approx. $5 \times 10^{10}$ cm$^{-2}$, i.e., approx. 0.25% in the gallium nitride intermediate layer which is 1.4 nm thick, for example, (as part of the spacer structure). Nevertheless, it is naturally conceivable to select a design containing relatively more charge carriers in the intermediate layer, for example, up to a few percent but less than 10% because of other requirements.

In general the charge carrier profile, i.e., the charge carrier density is a function of the position from the conduction band edge as shown in FIG. 4, for example. The lower the conduction band edge energetically, the greater is the charge carrier density at this location. If a layer sequence consisting of AlN (on the barrier side)/GaN/AlN (on the channel side) is considered, there may be following influences: the greater the layer thickness of the aluminum nitride on the channel side, the smaller is the charge carrier density in the gallium nitride layer. The thicker aluminum nitride energetically "raises" the conduction band in the gallium nitride. Furthermore, the greater the layer thickness of the gallium nitride layer, the greater is also the charge carrier density within it because a larger area of the gallium nitride with the conduction band is at a lower energy. One example of a choice of the layer thicknesses of the spacer structure is 0.7 nm aluminum nitride (on the barrier side)/1.4 nm GaN/0.8 nm AlN (channel side). The relationships described here apply, for example, for so-called group III polar materials (called III-face or also Ga-face) such as those used for nitridic transistors, for example. For example, if a so-called N-polar material (N-face) is used, then the other relationships will hold.

The spacer is used, for example, to protect the channel both during growth and in the finished structure from the negative effects of the barrier thanks to its stability and its electronic properties. Even if the barrier, e.g., in the case of AlGaN, has a different natural so-called relaxed lattice constant than the channel, there is stressed so-called pseudomorphic growth of the barrier (as well as the spacer). In other words, the lateral lattice constant (parallel to the layers) of the barrier is stretched or compressed to that of the channel. The barrier is then permanently under mechanical stress.

A longer lifetime can be expected if a barrier material having the same lateral constant (natural lateral constant) as the channel is chosen. Then the structure is stress free (apart from the thin aluminum nitride layers of the spacer. However, such lattice-matched compounds are not of a comparable quality, or hardly of the same quality as AlGaN, for example. However, if the spacer (spacer structure) described here is used, the quality of the material of the barriers has only a minor influence on the electrically relevant properties of the structure. The quality of the material here refers to the homogeneity of the barrier or other growth effects and the electrically relevant properties of the structure are, for example, the charge carrier mobility in the channel layer.

The use of three layers in the spacer structure instead of one thick aluminum nitride layer, for example, is necessitated because aluminum nitride layers with a thickness of more than approx. 1.4 nm on the channel layer are difficult to produce on the channel layer due to different lattice constants. The choice of gallium nitride as the material of the intermediate layer may be advantageous because it can be produced in a high quality and also has the same natural lattice constant as the channel layer, depending on the material of the channel layer.

As an alternative to gallium nitride, AlGaN may also be used as the material for the intermediate layer because it supplies fewer free charge carriers than GaN and therefore comprises a lower charge carrier density under the same conditions. Therefore AlGaN may have disadvantages with regard to material quality and/or the natural lattice constant in comparison with the cannel layer with respect to GaN.

Figure 5:
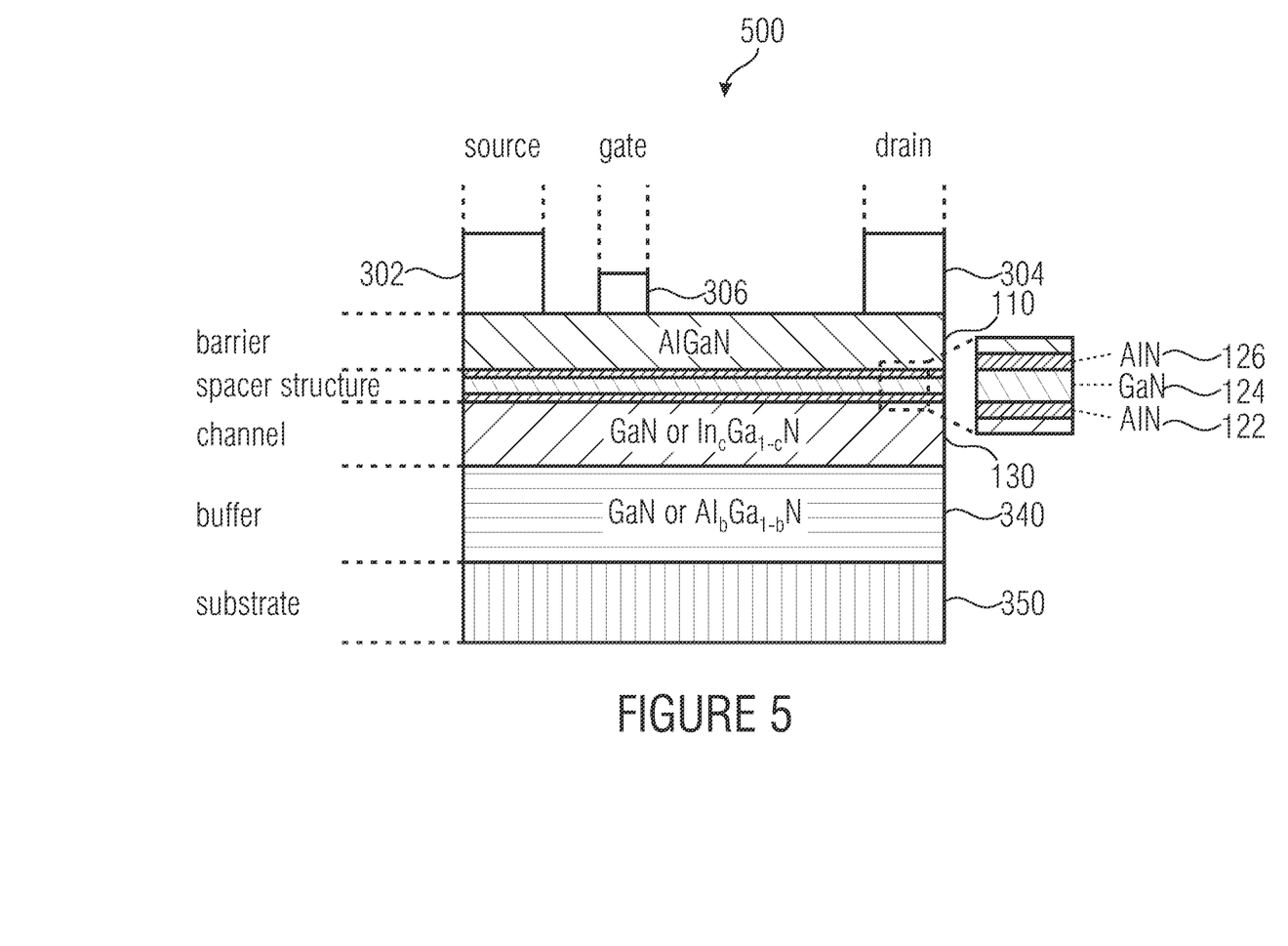
FIG. 5 shows a schematic cross section through a semiconductor structure.

As an alternative FIG. 5 shows another schematic cross section through a semiconductor structure 500 corresponding to an embodiment of the invention. The semiconductor structure 500 corresponds to the semiconductor structure shown in FIG. 3 but the spacer (spacer structure) is also combined with an AlGaN barrier layer Like the previous embodiment, the spacer is grown on the channel and the AlGaN barrier layer is grown on the spacer.

Like FIG. 3 the schematic drawing of FIG. 5 is not drawn true to scale.

In general the spacer structure is grown on the channel (channel layer) in which the two-dimensional electron gas is induced by the polarization of the spacer and of the barrier layer. In many embodiments the channel is made of gallium nitride. In other embodiments the channel may be made of $In_cGa_{1-c}N$ where c covers the range of 0 to 0.2, for example. In both cases, the channel may be grown on a buffer layer which can be produced from gallium nitride or from $Al_bGa_{1-b}N$ for example, where b is in the range of 0 to 0.1, for example. An intermediate layer produced from InGaN may optionally be introduced as an electrical rear side barrier between the channel (channel layer) and the buffer (buffer layer). The buffer layer may optionally have doping to improve the insulation or may have intermediate layers and/or microstructures or nanostructures to reduce defects. Furthermore, the buffer layer may be grown on a substrate, optionally using a nucleation layer. The substrate material may be, for example, silicon carbide SiC, sapphire, silicon, bulk GaN (volume GaN) or bulk AlN (volume AlN).

In several embodiments, a cover consisting of a single layer or multiple layers may optionally be grown onto the barrier layer. In some embodiments, some or all sections of the heterostructure, e.g., the buffer, the channel, the spacers, the barrier and/or the cover may be doped intentionally or unintentionally in the order of their growth, which also includes a modulated doping profile in the barrier layer.

The heterostructure may be grown by using any suitable technique which is performed with a sufficient quality of material and precision of thickness, including but not limited to molecular beam epitaxy (MBE) or metal organic chemical vapor deposition (MOCVD) as well as metal organic vapor phase epitaxy (MOVPE).

Using heterostructures or semiconductor structures such as those described above, HFET components can be produced on the surface of the semiconductor heterostructure by applying ohmic source and drain contacts and a gate contact between the source and the drain. Before applying any of the contacts, an optional recess setting may be performed in selected areas. An optional insulation layer may be introduced between the gate contact and the semiconductor surface. The components may be insulated laterally by using methods such as mesa etching or ion implantation. Additional components, for example, passivation layers, gate heads and/or field plates may also be added as part of the component process.

In some embodiments according to the invention, advantages are obtained from the effects of the spacer (spacer structure), for example, in combination with a quaternary barrier layer having a suitable composition. This permits, for example, implementation of a thin barrier layer thickness together with a high surface charge carrier density and a high electron mobility. Therefore short gate lengths which are essential for high speed applications may also be used.

By using an AlN/GaN/AlN triple-layer spacer such as that described, for example, in conjunction with the embodiment illustrated in FIG. 3, the separation between the two-dimensional electron gas in the channel and the barrier layer is increased in comparison with a single aluminum nitride intermediate layer, while at the same time the stress is kept at a moderate level because the middle GaN layer (intermediate layer) is naturally lattice-matched in the case of a GaN-based structure. The aluminum nitride layers also have a thickness of 0.6 nm to 0.7 nm, for example, which is much less than a typical known aluminum nitride intermediate layer with a thickness of 1 to 1.5 nm so that, for example, the development of defects in the aluminum nitride layers can be prevented. Furthermore, the triple-layer spacer may offer protection for the layers underneath when growth is continued after the spacer. This may be advantageous in particular when a lattice-matched AlInN layer or an AlGaInN layer is being grown. Because of the relatively low growth temperatures of the barrier layer, a growth interruption may be necessitated in order to lower the substrate temperature in stages. During the interruption the channel may be damaged due to defects caused by an exacerbation of the surface and the remaining reactor gases and later an exacerbation induced by the barrier layer and attributable to defects, e.g., in the AlGaInN material. Experiments have shown that harmful barrier layer influences on the 2DEG mobility are substantially lower in structures with a triple layer spacer than in those with a single aluminum nitride intermediate layer. The triple layer spacer (the spacer structure) therefore makes a significant contribution toward making the use of a lattice-matched barrier layer feasible. However, as already mentioned, this spacer substrate is not limited to three layers but instead may also have more than three layers.

An AlGaInN barrier layer with a suitable composition may have several advantages in comparison with both AlGaN and AlInN barrier layers. First, the lattice matching of AlGaInN such as that described in conjunction with the embodiment shown in FIG. 3, for example, may offer a stress-free barrier layer in contrast with AlGaN. Therefore fewer line defects are introduced during the growth of the material, which may permit more robust components. The lattice matching of the barrier layer may be adapted easily for double heterostructure drafts using an AlGaN buffer. Secondly, the miscibility of AlGaInN improves with an increase in the gallium content (see, for example, "Matsuoka, Appl. Phys. Lett. 71, 105-106, (1997)") so that the material quality is better than that of AlInN. As a direct effect the mobility of AlGaInN-based heterostructures may increase with the gallium concentration; at approx. 50% gallium it is comparable to that of AlGaN/GaN structures. With this lattice-matched AlGaInN composition, the aluminum concentration is still above 40%, so that a thin barrier layer having a thickness of less 10 nm together with the spacer can produce a 2DEG density (second free charge carrier density) of more than $2 \times 10^{13}$ $cm^{-2}$. The better miscibility of AlGaInN in comparison with AlInN may also allow higher growth temperatures, which can reduce the unintended introduction of impurities and improve the crystal quality. Thirdly because of the moderate aluminum concentration of AlGaInN, the metallurgy of titanium/aluminum-based ohmic source and drain contact may be more advantageous in comparison with that of AlInN (in this regard, see "Lu et al., IEEE Trans. Electron Devices 50, 1069-1074, (2003)"). This may be advantageous for lower terminal resistances, which are needed for HFETs with an improved efficiency and high-frequency capability.

Figure 6:
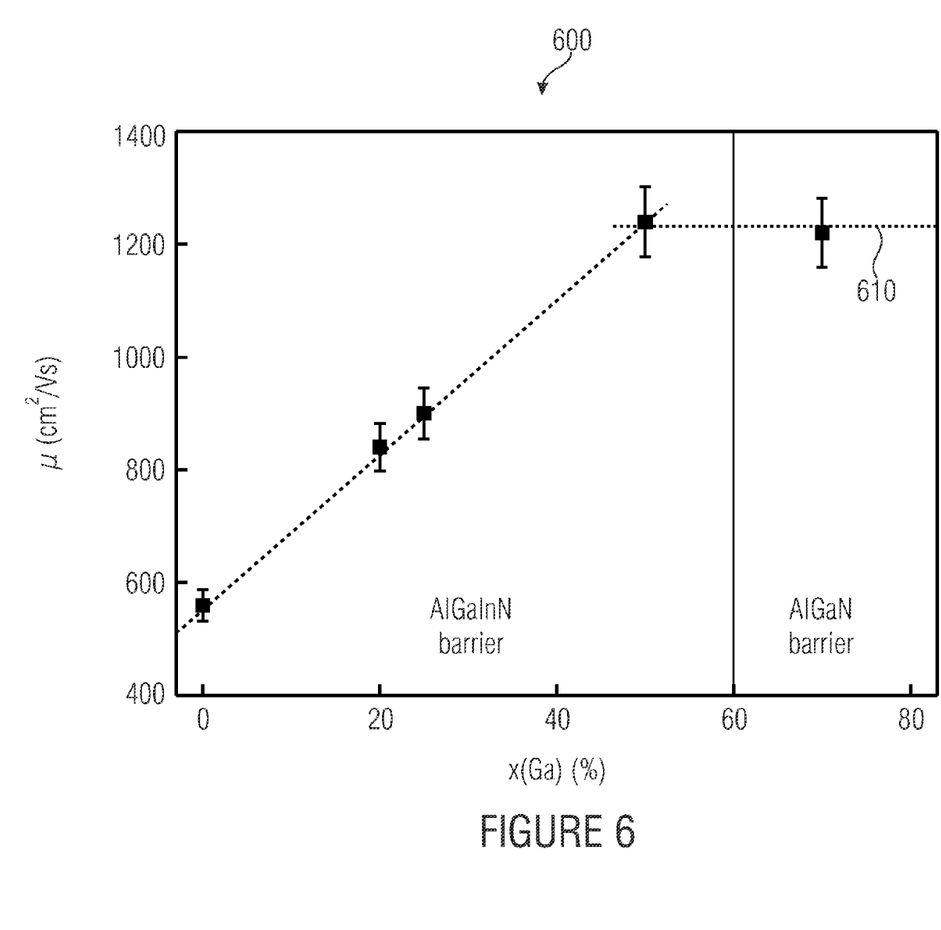
FIG. 6 shows a diagram of the charge carrier mobility at room temperature determined by Hall measurements on heterostructures and FIG. 7 shows a flow diagram of a method for producing a semiconductor structure.

In this regard, FIG. 4 shows, for example, the mobility 610 at room temperature, as determined by Hall measurements on heterostructures according to the embodiment of FIG. 3. The Al/In ratio in AlGaInN is 4.8 here. At 50% gallium concentration, the mobility is limited only by the quality of the GaN channel of the structure and not by barrier-based defects. The diagram 600 shows on the X axis the gallium concentration x(Ga) in % and on the Y axis the charge carrier mobility μ in cm²/Vs.

The embodiment shown in FIG. 3 can permit an almost stress-free semiconductor heterostructure by using the combined advantages of a multilayer spacer and an AlGaInN barrier layer in a suitable composition window; this semiconductor heterostructure at the same time supplies a high two-dimensional electron gas density and two-dimensional electron gas mobility, a thin barrier layer for good scalability with the gate length and/or a low terminal resistance for ohmic contacts.

The embodiment as shown in FIG. 5 can improve both the two-dimensional electron gas density and the two-dimensional electron gas mobility of AlGaN-based structures. Because of the separation between the 2DEG and the barrier layer, for example, the influence of the scattering in an alloy is reduced by introducing the spacers. As described above, a greater separation is possible in comparison with a single AlN intermediate layer without increasing the tension in the structure. Moreover, the conduction band gap can be increased by the spacer with regard to the barrier, so that the charge carrier restriction on the two-dimensional electron gas can be improved.

Some embodiments according to the invention relate to the use of AlGaN as a barrier layer. With improved quality of the materials, for example, with an additional reduction in the defect density, the robustness and reliability of such AlGaN-based components can be improved so that they are comparable to or even better than lattice-matched structures which usually have a higher defect density.

Furthermore, AlInN may also be used as a barrier material. Higher two-dimensional electron gas mobilities can be achieved by improving the quality of the material of ternary AlInN. However, due to its non-miscibility, it would seem difficult for AlInN to be grown with a sufficient gallium concentration in a quality similar to that of AlGaN or AlGaInN.

The advantages of AlInN, especially the production of almost stress-free heterostructures with high surface electron densities can be retained by using sufficient aluminum-rich quaternary AlGaInN in an Al/In ratio of approx. 4.7, which supplies compounds that are lattice-matched with respect to GaN. A heterostructure based on lattice-matched AlGaInN with an aluminum content of more than 30% and good mobility may be possible.

Some embodiments according to the invention are based on a nitride-based heterostructure field effect transistor.

The inventive concept described here comprises a semiconductor heterostructure which comprises a multilayer spacer grown on a channel and a barrier layer grown on the spacer. This heterostructure can be processed to produce an HFET component.

Nitride HFET structures with lattice-matched layers, a thin barrier layer, a high 2DEG density and 2DEG mobility and/or a low terminal resistance such as those described in the embodiment of FIG. 3 (and FIG. 5), for example, are candidates for power applications at high frequencies up into the millimeter wavelength range. Although nitrides of group III permit the highest power density in the range above 1 GHz of all material systems currently in use for semiconductor power amplifiers, established applications usually cover the range between 2 and 12 GHz. At higher frequencies, for example, around 35 GHz and 94 GHz for radar with a high spatial resolution, nitride HFETs can offer power levels not previously accessible for solid-state systems. Higher powers are also of interest for spacer holder applications in the millimeter wavelength range.

Lattice-matched structures have the advantages of a greater robustness, among other things, which are beneficial in an application under hostile conditions, for example, at high temperatures or under high inertial and vibrational stress, for example, with systems in air. For electronic power units as well, the greater robustness of stress-free structures is also advantageous. The use of lattice-matched structures can improve the reliability and lifetime for typical microwave applications, for example, mobile communication base stations and radar modules.

Figure 7:
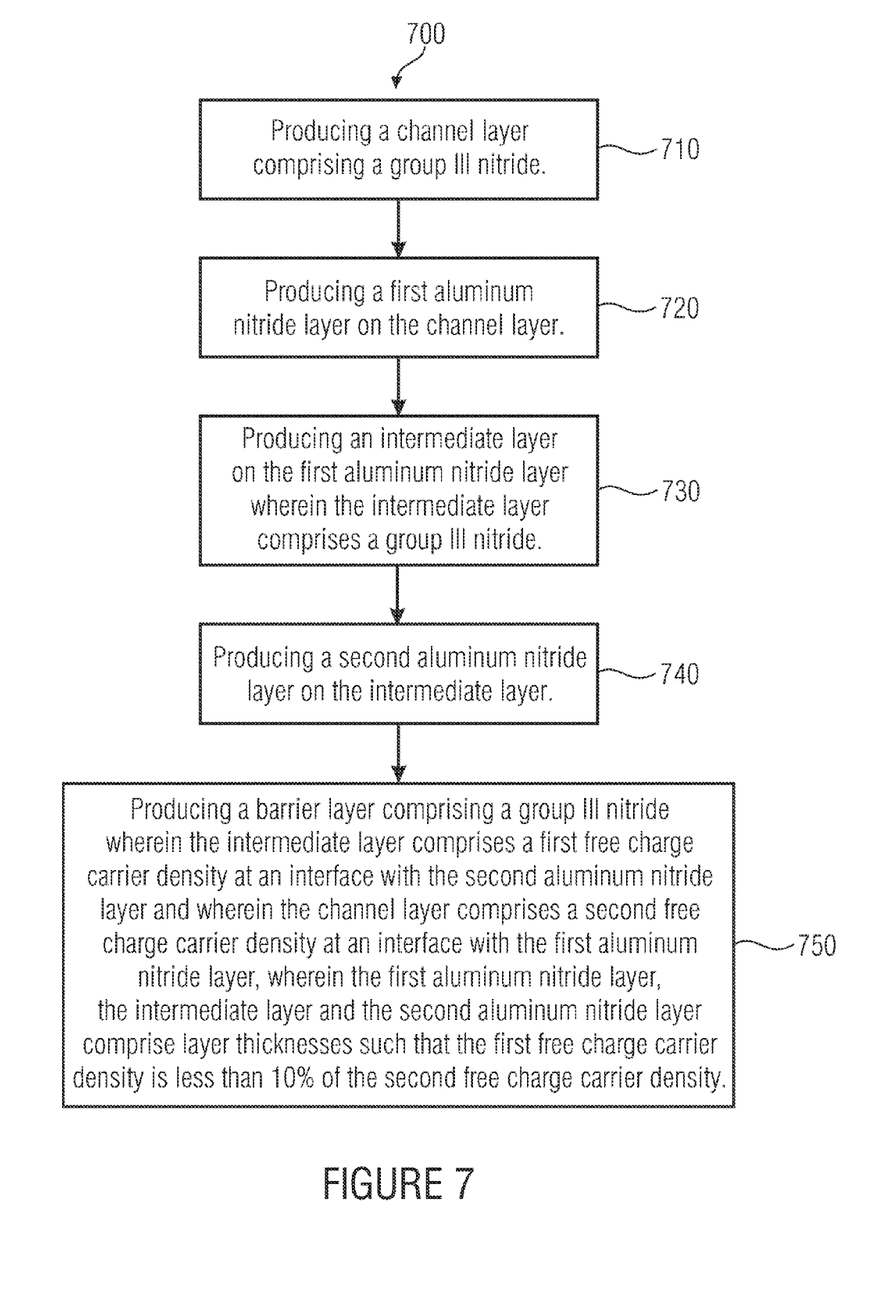

FIG. 7 shows a flow diagram of a method 700 for producing a semiconductor structure according to an embodiment of the invention. The method 700 comprises producing 710 a channel layer, producing 720 a first aluminum nitride layer on the channel layer, producing 730 an intermediate layer on the first aluminum nitride layer, producing 740 a second aluminum nitride layer on the intermediate layer and producing 750 a barrier layer on the second aluminum nitride layer. The intermediate layer comprises a first free charge carrier density on an interface with the second aluminum nitride layer, and the channel layer comprises a second free charge carrier density at an interface with the first aluminum nitride layer. The first aluminum nitride layer, the second aluminum nitride layer and the intermediate layer comprise layer thicknesses such that the free charge carrier density is less than 10% of the second free charge carrier density. The barrier layer, the intermediate layer and the channel layer comprise a group III nitride.

Although many aspects have been described in conjunction with a device, it is self-evident that these aspects also represent a description of the corresponding method, so that a block or a component of a device is also to be understood as a corresponding method step or as a feature of a method step. Similarly, aspects described in conjunction with one method step or as a method step also constitute a description of a corresponding block or detail or feature of a corresponding device.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is
1. A semiconductor structure comprising:
a barrier layer comprising AlGaInN, AlInN or AlGaN;
a spacer structure comprising a first aluminum nitride layer, an intermediate layer and a second aluminum nitride layer, wherein the intermediate layer comprises a group III nitride and is arranged between the first aluminum nitride layer and the second aluminum nitride layer and wherein the intermediate layer comprises a first free charge carrier density at an interface with the second aluminum nitride layer; and
a channel layer comprising a group III nitride, wherein the spacer structure is arranged between the barrier layer and the channel layer,
wherein the spacer structure is grown on the channel layer and the AlGaInN barrier layer, the AlInN barrier layer or the AlGaN barrier layer is grown on the spacer structure, and wherein the channel layer comprises a second free charge carrier density at an interface with the first aluminum nitride layer of the spacer structure, wherein the first aluminum nitride layer, the intermediate layer and the second aluminum nitride layer comprise layer thicknesses such that the first free charge carrier density is less than 10% of the second free charge carrier density.

2. The semiconductor structure according to claim 1, wherein the layer thickness of the intermediate layer is less than two times the layer thickness of the first aluminum nitride layer or wherein the layer thickness of the intermediate layer is less than 1.9 times the layer thickness of the first aluminum nitride layer minus 0.1 nm.

3. The semiconductor structure according to claim 1, wherein the first aluminum nitride layer and the second aluminum nitride layer comprise layer thicknesses greater than 0.4 nm and less than 1.4 nm and wherein the intermediate layer comprises a layer thickness of less than 1.5 nm.

4. The semiconductor structure according to claim 1, wherein the barrier layer, the intermediate layer and the channel layer each comprise such a group III nitride so that in combination with the layer thicknesses of the first aluminum nitride layer, the second aluminum nitride layer and the intermediate layer, the first free charge carrier density is less than 10% of the second free charge carrier density.

5. The semiconductor structure according to claim 1, wherein the intermediate layer comprises GaN.

6. The semiconductor structure according to claim 1, wherein the channel layer comprises GaN or InGaN.

7. The semiconductor structure according to claim 1, wherein the barrier layer, the first aluminum nitride layer, the intermediate layer, the second aluminum nitride layer and the channel layer are designed so that the conduction band of the semiconductor structure in the channel layer comprises an energy minimum.

8. A transistor comprising:
a semiconductor structure comprising:
a barrier layer comprising AlGaInN, AlInN or AlGaN;
a spacer structure comprising a first aluminum nitride layer, an intermediate layer and a second aluminum nitride layer, wherein the intermediate layer comprises a group III nitride and is arranged between the first aluminum nitride layer and the second aluminum nitride layer and wherein the intermediate layer comprises a first free charge carrier density at an interface with the second aluminum nitride layer; and
a channel layer comprising a group III nitride, wherein the spacer structure is arranged between the barrier layer and the channel layer,
wherein the spacer structure is grown on the channel layer and the AlGaInN barrier layer, the AlInN barrier layer or the AlGaN barrier layer is grown on the spacer structure,
and wherein the channel layer comprises a second free charge carrier density at an interface with the first aluminum nitride layer of the spacer structure, wherein the first aluminum nitride layer, the intermediate layer and the second aluminum nitride layer comprise layer thicknesses such that the first free charge carrier density is less than 10% of the second free charge carrier density;
a source contact which is electrically connected to the channel layer;
a drain contact which is electrically connected to the channel layer;
a gate contact which is arranged between the source contact and the drain contact and is designed to control an amperage of an electric current between the source contact and the drain contact in the channel layer by applying an electric gate potential.

9. A semiconductor structure comprising:
a barrier layer comprising AlGaInN, AlInN or AlGaN;
a spacer structure comprising a first aluminum nitride layer, a second aluminum nitride layer and a gallium nitride layer, wherein the first aluminum nitride layer comprises a layer thickness between 0.4 nm and 1.4 nm, wherein the second aluminum nitride layer comprises a layer thickness between 0.4 nm and 1.4 nm, wherein the gallium nitride layer comprises a layer thickness of less than 1.5 nm, wherein the gallium nitride layer is arranged between the first aluminum nitride layer and the second aluminum nitride layer and wherein the gallium nitride layer comprises a first free charge carrier density at an interface with the second aluminum nitride layer; and
a channel layer comprising gallium nitride or InGaN, wherein the spacer structure is arranged between the barrier layer and the channel layer,
wherein the spacer structure is grown on the channel layer and the AlGaInN barrier layer, the AlInN barrier layer or the AlGaN barrier layer is grown on the spacer structure,
and wherein the channel layer comprises a second free charge carrier density at an interface with the first aluminum nitride layer of the spacer structure, wherein the first aluminum nitride layer, the gallium nitride layer and the second aluminum nitride layer comprise layer thicknesses such that the first free charge carrier density is less than 10% of the second free charge carrier density.

10. A method for producing a semiconductor structure, comprising:
producing a channel layer comprising a group III nitride;
producing a first aluminum nitride layer on the channel layer;
producing an intermediate layer on the first aluminum nitride layer wherein the intermediate layer comprises a group III nitride;
producing a second aluminum nitride layer on the intermediate layer; and
producing a barrier layer comprising a group III nitride, wherein an AlGaInN barrier layer, an AlInN barrier layer or an AlGaN barrier layer is grown on the second aluminum nitride layer, wherein the intermediate layer comprises a first free charge carrier density at an interface with the second aluminum nitride layer and wherein the channel layer comprises a second free charge carrier density at an interface with the first aluminum nitride layer, wherein the first aluminum nitride layer, the intermediate layer and the second aluminum nitride layer comprise layer thicknesses such that the first free charge carrier density is less than 10% of the second free charge carrier density.

11. The method according to claim 10 wherein the intermediate layer and the first aluminum nitride layer are produced so that the layer thickness of the intermediate layer is less than two times the layer thickness of the first aluminum nitride layer or so that the layer thickness of the intermediate layer is less than 1.9 times the layer thickness of the first aluminum nitride layer minus 0.1 nm.

12. The method according to claim 10 wherein the intermediate layer, the first aluminum nitride layer and the second aluminum nitride layer are produced so that the first aluminum nitride layer and the second aluminum nitride layer comprise layer thicknesses greater than 0.4 nm and less than 1.4 nm so that the intermediate layer comprises a layer thickness of less than 1.5 nm.

* * * * *